United States Patent
Kim

(10) Patent No.: US 7,183,209 B2
(45) Date of Patent: Feb. 27, 2007

(54) SEMICONDUCTOR DEVICE AND MANUFACTURING METHOD THEREOF

(75) Inventor: Rae Sung Kim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/998,221

(22) Filed: Nov. 26, 2004

(65) Prior Publication Data
US 2005/0112867 A1    May 26, 2005

(30) Foreign Application Priority Data
Nov. 26, 2003  (KR) .................. 10-2003-0084525

(51) Int. Cl.
*H01L 21/44* (2006.01)
(52) U.S. Cl. .................. 438/687; 257/E21.591
(58) Field of Classification Search .............. 438/197, 438/199, 213, 220, 223–224, 227–228, 275–276, 438/279, 289–291, 308, 473–474, 476, 480, 438/531–515
See application file for complete search history.

(56) References Cited

U.S. PATENT DOCUMENTS

| 6,217,658 | B1 | 4/2001 | Orczyk et al. |
| 6,218,284 | B1 | 4/2001 | Liu et al. |
| 6,284,677 | B1 | 9/2001 | Hsiao et al. |
| 6,376,360 | B1 | 4/2002 | Cha et al. |
| 2004/0048468 | A1* | 3/2004 | Liu et al. ............ 438/687 |
| 2004/0067658 | A1* | 4/2004 | Ko et al. ............ 438/778 |
| 2004/0082199 | A1* | 4/2004 | Cheung et al. ...... 438/789 |
| 2004/0127016 | A1* | 7/2004 | Hoog et al. ......... 438/637 |
| 2005/0181623 | A1* | 8/2005 | Bencher et al. ..... 438/761 |
| 2005/0191851 | A1* | 9/2005 | Liu et al. ............ 438/634 |

OTHER PUBLICATIONS

Wolf et al., Silicon Processing for the VLSI Era, vol. 2, Lattice Press, 1990, pp. 196-199.*

* cited by examiner

*Primary Examiner*—Walter Lindsay, Jr.
*Assistant Examiner*—Andre' Stevenson
(74) *Attorney, Agent, or Firm*—Andrew D. Fortney

(57) ABSTRACT

The semiconductor device fabrication method of the present invention includes forming metal wirings on a semiconductor substrate, forming a first blocking layer on the semiconductor substrate and the metal wiring, forming a first FSG on the first blocking layer, forming a second blocking layer on the first FSG, forming a second FSG on the second blocking layer, and forming a protection layer on the second FSG.

18 Claims, 3 Drawing Sheets

SEMICONDUCTOR DEVICE AND MANUFACTURING METHOD THEREOF

BACKGROUND OF THE INVENTION (a) Field of the Invention

The present invention relates to a semiconductor device and a method for fabricating the semiconductor device.

(b) Description of the Related Art

As the semiconductor device has been highly integrated, number of metal wirings increases and the pitch of each metal wiring become reduced. The reduction of pitch causes to increase resistance of the metal wiring and to create a parasite capacitor structure by the inter metal dielectric (IMD) for isolating the metal wirings of the semiconductor and the metal wiring itself, that deteriorate the characteristic of the semiconductor device. That is, the RC constant value determining a response speed of the semiconductor device increases and the power consumption increases.

Accordingly, an IMD having low dielectric constant appropriate for highly integrated semiconductor device has been required and recently fluorine silicate glass (FSG) is used as the low dielectric constant IMD in place of the conventional un-doped silica glass IUSG.

Unlike the conventional USG, in case of using the fluorine-added FSG for maintaining the low dielectric constant a block layer should be formed between the metal wirings and the FSG for protecting movement of the fluorine because the fluorine has high mobility. However, if the block layer formed having defect, the fluorine can be changed into HF due to the hydrogen (H) existing with heat and impurity generated in following process so as to penetrate to damage AL.

In this case a via resistance increases and a metal bridge is created so as to degrade the reliability and yield of the semiconductor devices.

The U.S. Pat. Nos. 6,376,360, U.S. Pat. No. 6,284,677, and U.S. Pat. No. 6,217,658 have disclosed the techniques for protecting the low metal layer with a spread protection layer formed in a single layered structure and using the sidewalls.

SUMMARY OF THE INVENTION

The present invention has been made in an effort to solve the above problems, and it is an object of the present invention to provide a semiconductor device and fabricating method thereof which is capable of improving reliability and yield by protecting the damage of the Al by blocking the movement of the fluorine.

In order to achieve the above object, the method for fabricating semiconductor device according to the present invention includes forming metal wirings on a semiconductor substrate, forming a first blocking layer on the semiconductor substrate and the metal wiring, forming a first FSG on the first blocking layer, forming a second blocking layer on the first FSG, forming a second FSG on the second blocking layer, and forming a protection layer on the second FSG.

Preferably, the first blocking layer, the first FSG, the second blocking, and the second FSG are formed using single equipment.

Preferably, the first and second blocking layer is formed out of USG.

Preferably, the first and the second blocking layers are form at thicknesses in the range from 30 to 2000 Å.

The semiconductor device fabrication method further includes planarizing the protection layer, forming contact holes penetrating the protection layer, the second FSG, the second blocking layer, the first FSG, and the first blocking layer, and forming a wiring layer on the protection layer, the wiring layer connecting to the metal wirings through the contact holes.

The semiconductor device fabrication method further includes forming a third blocking layer on the second FSG and a third FSG on the third blocking layer before forming the protection layer.

A semiconductor device of the present invention includes a semiconductor substrate, metal wirings formed on the semiconductor substrate, a first blocking layer formed on the semiconductor substrate and the metal wirings, a first FSG formed on the first blocking layer, a second blocking layer formed on the first FSG, a second FSG formed on the second blocking layer, and a protection layer formed on the second FSG.

Preferably, the first and the second blocking layers are formed at thicknesses in the range from 30 to 2000 Å.

Preferably, the semiconductor device further includes a third blocking layer formed on the second FSG and the third FSG formed on the third blocking layer.

DETAILED DESCRIPTION OF THE PREFERRED EMBODIMENTS

Figure 1:
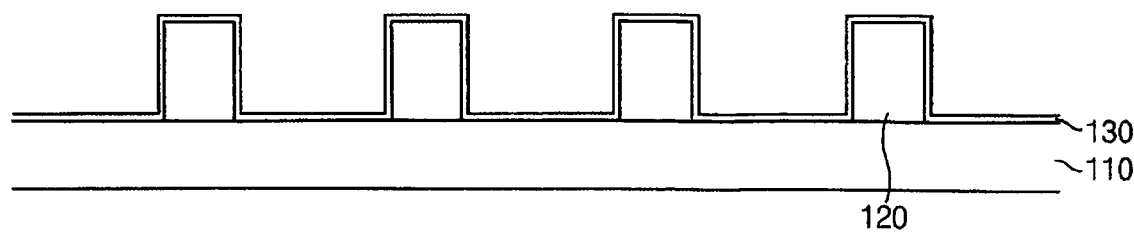
FIG. 1 to FIG. 7 are cross sectional views illustrating fabricating steps of a semiconductor device according to the preferred embodiment of the present invention.

The details of the present invention will be described hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

A semiconductor device and fabricating method thereof according to a preferred embodiment of the present invention will be described hereinafter with reference to the accompanying drawings.

Figure 6:
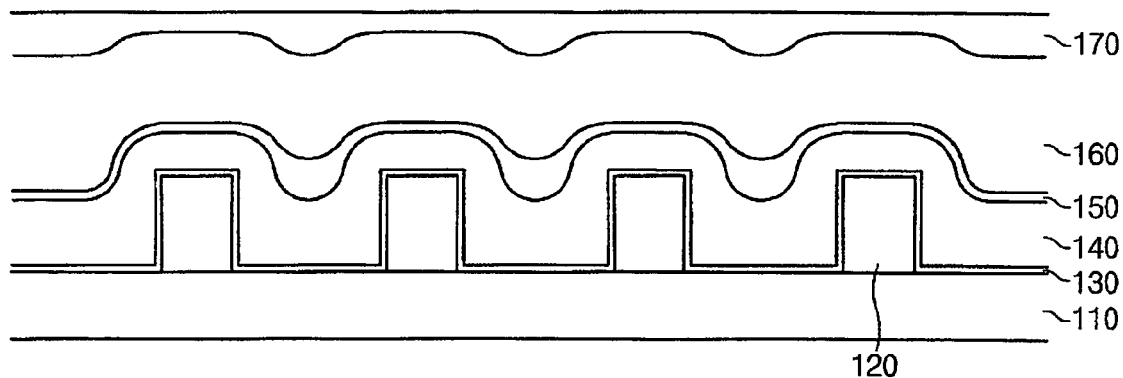
Figure 7:
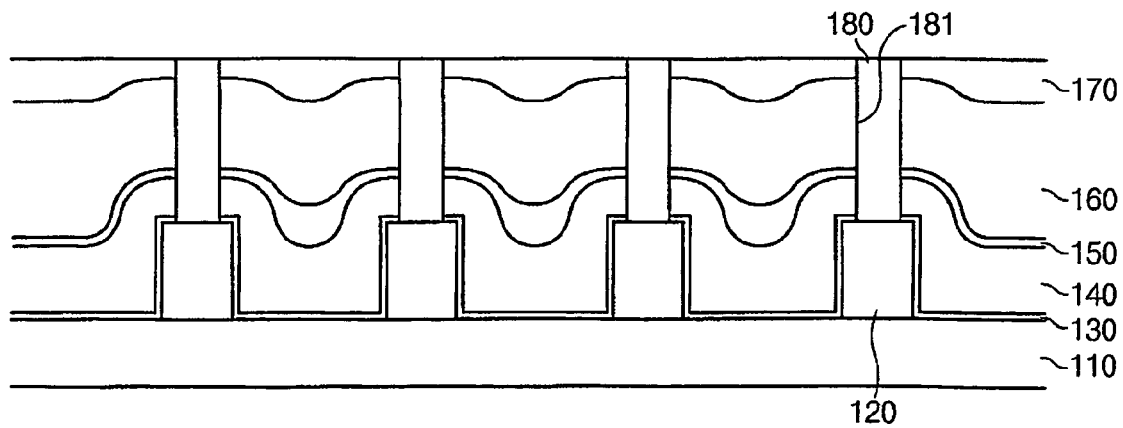
Figure 8:
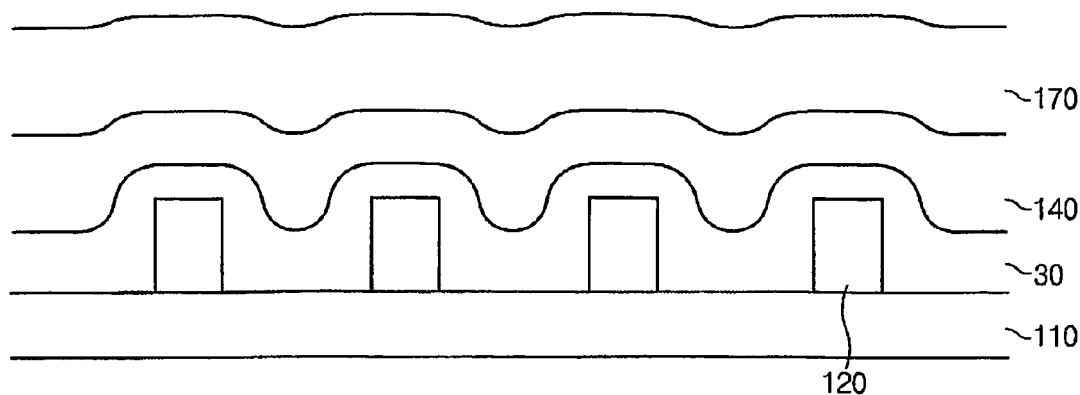
FIG. 8 to FIG. 10 are cross sectional views illustrating some fabricating steps of a conventional semiconductor device.
Figure 9:
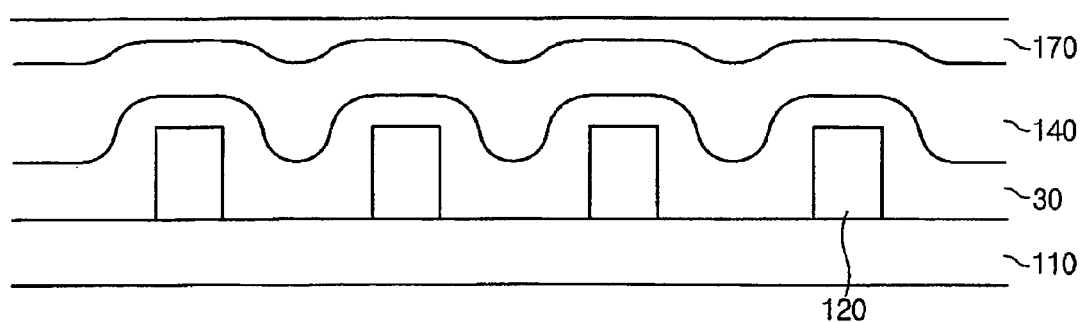
Figure 10:
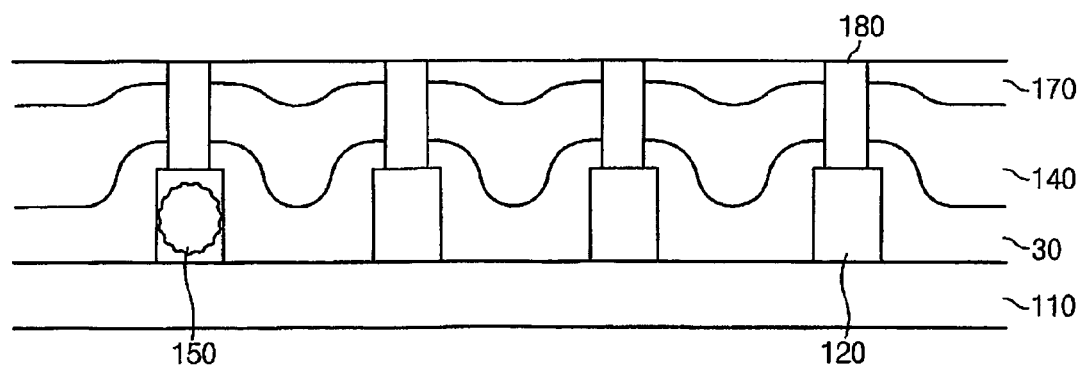

FIG. 1 to FIG. 7 are cross sectional views illustrating fabricating steps of a semiconductor device according to the preferred embodiment of the present invention and FIG. 8 to FIG. 10 are cross sectional views illustrating some fabricating steps of a conventional semiconductor device.

As shown in FIG. 1, in the method for fabricating semiconductor device according to the preferred embodiment of the present invention metal wirings 120 are formed on a semiconductor substrate 110 and a first blocking layer 130 is formed on the semiconductor substrate 110 and the metal wirings 120.

The metal wiring is made out of Al, and the first blocking layer 130 is made of USG at a thickness in the range from 30 to 2000 Å.

Figure 2:
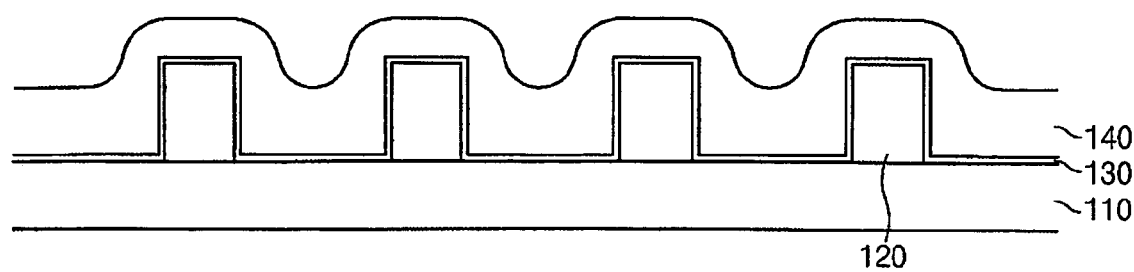

As shown in FIG. 2, a first FSG 140 is formed on the first blocking layer 130. Thus, the first blocking layer 130 prevents the fluorine (F) contained in the first FSG 140 from contacting the metal wiring 120.

The first blocking layer 130 and the first FSG 140 are formed by single deposition equipment, i.e. high density plasma (HDP) equipment.

As shown in FIG. 8 to FIG. 10, conventionally the blocking layer 30 of the metal wirings 120 and the FSG 140 is formed in a single layer structure from a silicon rich oxide (SRO) or SiON. Accordingly, after the blocking layer formation process, the deposition equipment should be changed for carrying out the FSG formation process there has been semiconductor fabrication process delay.

In case of forming the blocking layer for the metal wirings 120 and the FSG 140 from the USG 130 as in the preferred embodiment of the present invention, the USG 130 and the FSG 140 are sequentially formed using a single HDP equipment so as to reduce the time taken for fabricating the semiconductor device.

Figure 3:
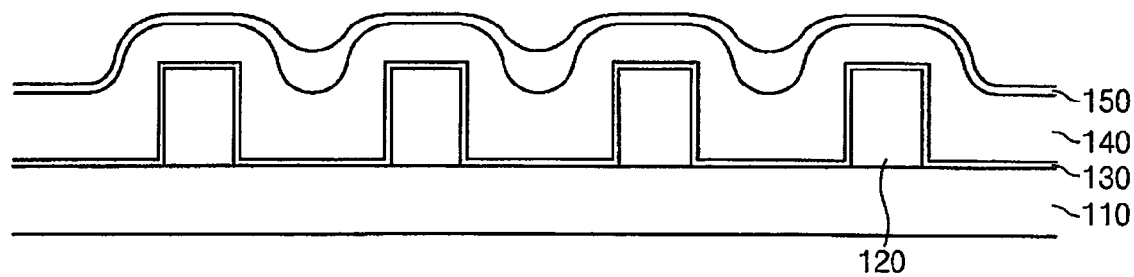

As shown in FIG. 3, a second blocking layer 150 is formed on the first FSG 140. Preferably, the second blocking layer 150 is formed out of un-doped silica glass (USG) at a thickness in the range from 30 to 2000 Å.

Figure 4:
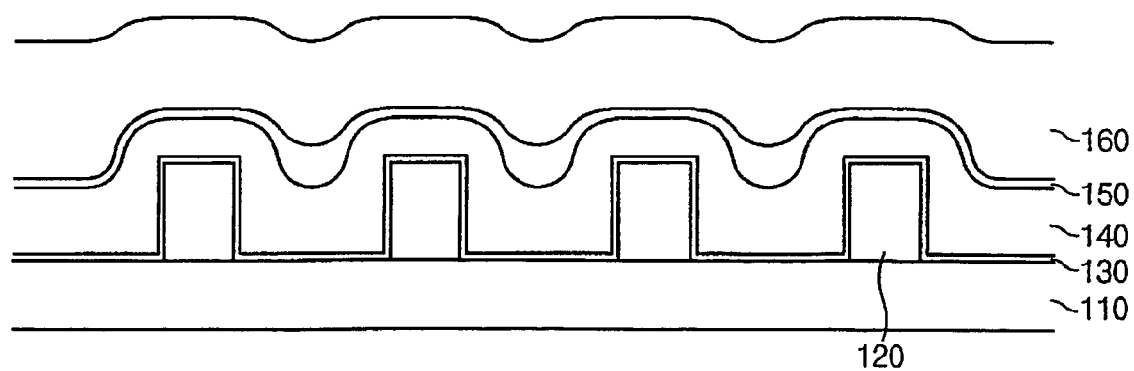

As shown in FIG. 4, a second fluorine silicate glass (FSG) 160 is formed on the second blocking layer 150.

The second blocking layer 150 and the second FSG 160 is sequentially formed using single deposition equipment, i.e., a high density plasma (HDP).

Since multiple blocking layers, i.e., the first and second blocking layers are formed so as to efficiently protect the movement of the fluorine, it is possible to prevent the metal wirings from being damaged.

By forming the blocking layer in a dual layered structure having the first and second blocking layers 10 and 150 in place of the conventional thick blocking layer 30, it is possible to avoid the reduction of the response speed (gap fill issue) of the semiconductor device.

This will be described hereinafter.

As shown in FIG. 8 to FIG. 10, in case of forming the thick blocking layer 30 on the metal wirings 120, the spaces between the metal wirings are filled with the thick blocking layer 30 such that the low dielectric constant FSG 140 can not be formed between the metal wirings(Gap fill issue). Accordingly, the metal wirings 120 and the thick blocking layer 30 generate a parasite capacity structure, which deteriorate the characteristic of the semiconductor. That is, the RC constant determining the response speed of the semiconductor device and the power consumption increase so as to deteriorate the response time of the semiconductor device.

In the preferred embodiment of the present invention, however, the blocking layer is formed in a multilayered structure having the first and second blocking layers 130 and 150 that are thin such that the first and second FSGs 140 and 160 having the low dielectric constant are formed between the metal wirings, thereby the gap fill issue is not occurred so as to avoid the deterioration of the response time of the semiconductor device.

As described above, the gap fill issue can occur if the blocking layer is thick, and the metal wirings 120 can be damaged by the movement of the fluorine if the blocking layer is thin, such that these problems can be solved forming the blocking layer in dual layered structure having two thin blocking layers 130 and 150 as in the preferred embodiment of the present invention.

Figure 5:
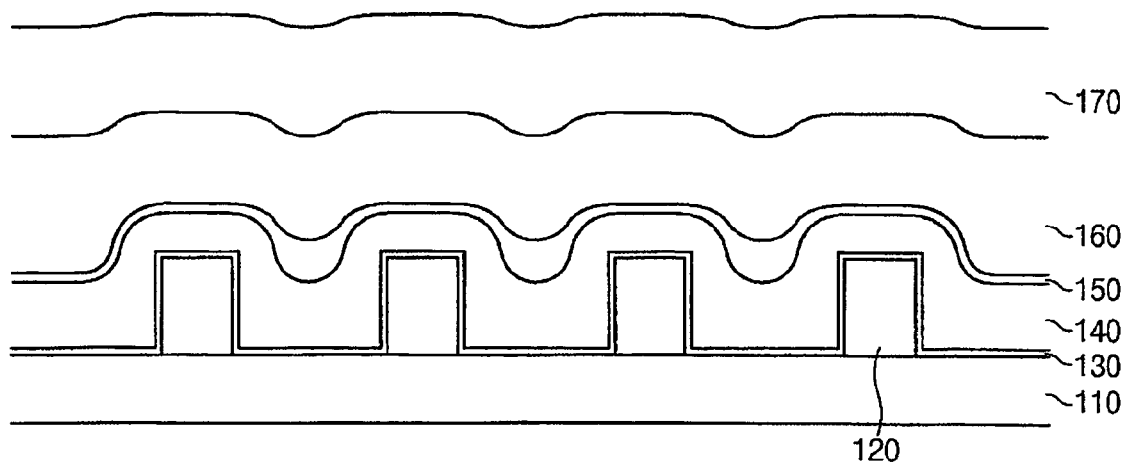

As shown in FIG. 5, a protection layer 170 made from PECVD is formed on the second FSG 160.

As shown in FIG. 6, the protection layer 170 is planarized through a chemical mechanical polishing (CMP) process.

As shown in FIG. 7, a contact hole 181 is formed so as to penetrate the protection layer 170, the second FSG 160, the second blocking layer 150, the first FSG 140, and the first blocking layer 130, and then a wiring layer (not shown) is formed on the protection layer 170 so as to contact the metal wiring 120 through the contact hole 181.

As shown in FIG. 10, in case of forming the conventional single blocking layer 30, the fluorine can be changed into HF caused by the hydrogen (H) existing with heat and impurity so as to penetrate into the metal wiring 120, resulting in damage part (150) of the metal wirings 120. However, since the blocking layer is formed with multiple thin layers so as to avoid the occurrence of the damage part of the metal wirings in the preferred embodiment of the present invention.

In the meantime, a third blocking layer and third FSG layer can be sequentially formed on the second FSG 160 before forming the protection layer 170 so as to improve the reliability and yield of the semiconductor device.

The operation of the semiconductor device fabricated according to the semiconductor fabrication method as described above will be described hereinafter.

FIG. 7 is a cross sectional view illustrating a structure of the semiconductor according to the preferred embodiment of the present invention.

As shown in FIG. 7, the semiconductor device according to the preferred embodiment of the present invention includes a semiconductor substrate 110 having metal wirings 120 formed thereon and the first blocking layer 130 deposited on the semiconductor substrate 110 and the metal wirings 120.

Next, the first FSG 140, the second blocking layer 150, and the second FSG 160 are sequentially formed on the first layer 130.

The protection layer 170 is formed and then planarized on the second FSG 160, the contact plugs 180 are formed within the contact holes 181 that are formed through the first blocking layer 130, the first FSG 140, second blocking layer 150, the second FSG 160, and the protection layer 170, so as to electrically connecting the metal wirings formed on the protection layer 170 and the metal wirings 120 formed on the semiconductor substrate 110.

Here, the first blocking layer 130 and the second blocking layer 150 prevent the first FSG 140 and the second FSG 160 from damaging the metal wirings 120, and the first FSG 140 and the second FSG 160 prevent the fluorine from diffusing to the adjacent layers.

The first blocking layer 130 and the second blocking layer 150 are preferably formed out of un-doped silicate glass. Also, the first and second blocking layers 130 and 150 are preferably formed at thicknesses in the range from 30 to 2000□.

In order to improve the reliability and yield of the semiconductor device the third blocking layer and the third FSG layer can be formed on the second FSG 160.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

The semiconductor device according to the present invention includes the FSG and blocking layer formed in multiple thin layered structure and the FSG and the blocking layers are deposited using the single equipment such that it is possible to avoid the movement of the fluorine and reduce the time taken for deposition process.

Also, the present invention has advantages to improve the reliability and yield of the semiconductor device by avoiding the damage of the metal wirings, the resistance increase of the contact plug, and metal bride.

What is claimed is:

1. A semiconductor device comprising:
    a semiconductor substrate;
    metal wirings on the semiconductor substrate;
    a first blocking layer comprising USG, covering the semiconductor substrate and the metal wirings, contacting side walls of the metal wirings, and filling a gap between the metal wirings;
    a FSG layer on the first blocking layer;
    a second blocking layer comprising USG on the FSG layer;
    an inter-metal dielectric layer comprising FSG on the second blocking layer; and
    a protection layer on the inter-metal dielectric layer.

2. The semiconductor device of claim 1, wherein the first and the second blocking layers have a thickness in the range from 30 to 2000 Å.

3. The semiconductor device of claim 1 further comprising a third blocking layer on the inter-metal dielectric layer and a second inter-metal dielectric layer on the third blocking layer.

4. The semiconductor device of claim 3, wherein the second inter-metal dielectric layer comprises FSG.

5. The semiconductor device of claim 1, comprising a planar protection layer.

6. The semiconductor device of claim 5, further comprising a wiring layer on the protection layer.

7. The semiconductor device of claim 6, wherein the wiring layer connects to the metal wirings through contacts.

8. The semiconductor device of claim 3, comprising a planar protection layer.

9. The semiconductor device of claim 8, further comprising a wiring layer on the protection layer.

10. The semiconductor device of claim 9, wherein the wiring layer connects to the metal wirings through contacts.

11. The semiconductor device of claim 2, further comprising a third blocking layer on the inter-metal dielectric layer and a second inter-metal dielectric layer on the third blocking layer.

12. The semiconductor device of claim 11, wherein the second inter-metal dielectric layer comprises FSG.

13. The semiconductor device of claim 12, comprising a planar protection layer.

14. The semiconductor device of claim 13, further comprising a wiring layer on the protection layer.

15. The semiconductor device of claim 14, wherein the wiring layer connects to the metal wirings through contact.

16. The semiconductor device of claim 1, wherein the gap between the metal wirings is further filled with the FSG layer.

17. The semiconductor device of claim 1, wherein the gap between the metal wirings is further filled with the second blocking layer.

18. The semiconductor device of claim 1, wherein the gap between the metal wirings is further filled with the inter-metal dielectric layer.

* * * * *